(12) United States Patent
Kanbe et al.

(10) Patent No.: US 11,211,326 B2
(45) Date of Patent: Dec. 28, 2021

(54) WIRING SUBSTRATE AND MANUFACTURING METHOD THEREOF

(71) Applicant: SHINKO ELECTRIC INDUSTRIES CO., LTD., Nagano (JP)

(72) Inventors: Yoshihisa Kanbe, Nagano (JP);
Tomoyuki Shimodaira, Nagano (JP);
Takashi Sato, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/910,239

(22) Filed: Jun. 24, 2020

(65) Prior Publication Data

US 2020/0411432 A1    Dec. 31, 2020

(30) Foreign Application Priority Data

Jun. 26, 2019  (JP) .............................. JP2019-118616

(51) Int. Cl.
*H01L 23/522* (2006.01)
*H01L 21/768* (2006.01)
*H01L 23/528* (2006.01)

(52) U.S. Cl.
CPC .... *H01L 23/5226* (2013.01); *H01L 21/76841* (2013.01); *H01L 21/76877* (2013.01); *H01L 23/528* (2013.01)

(58) Field of Classification Search
CPC ... H01L 23/498; H01L 23/528; H01L 23/522; H01L 23/5226; H01L 23/49811; H01L 23/49816; H01L 23/49894; H01L 23/49827; H01L 21/48; H01L 21/768; H01L 21/76841; H01L 21/76877; H01L 21/4857; H01L 21/02052; H01L 21/02101; H01L 21/02046; H01L 21/02096; H01L 21/02049; H01L 21/02054; H01L 21/0206; H01L 21/02065; H01L 21/02076; H01L 21/02085; H01L 21/02093; H01L 21/02334; H01L 2224/80012
USPC ......................................................... 438/618
See application file for complete search history.

(56) References Cited

U.S. PATENT DOCUMENTS

2007/0131243 A1    6/2007  Asahi et al.
2009/0186431 A1*   7/2009  Tanaka .................... H01L 24/82
                                                    438/22
2015/0340270 A1*  11/2015  Nosaka ............ H01L 21/02074
                                                    438/14

FOREIGN PATENT DOCUMENTS

JP      2007-103878    4/2007

* cited by examiner

*Primary Examiner* — Chuong A Luu
(74) *Attorney, Agent, or Firm* — Rankin, Hill & Clark LLP

(57) ABSTRACT

An insulating layer containing fillers is formed to cover a first wiring layer. An opening portion, in which the first wiring layer is exposed, is formed in the insulating layer. A first alkali treatment, an ultrasonic cleaning treatment, and a second alkali treatment are sequentially performed on an upper surface of the insulating layer, on an inner wall surface of the opening portion, and an upper surface of the first wiring layer exposed in the opening portion. A second wiring layer electrically connected to the first wiring layer is formed by filling the opening portion by plating. The second wiring layer extends from an inside of the opening portion to the upper surface of the insulating layer.

10 Claims, 11 Drawing Sheets

WIRING SUBSTRATE AND MANUFACTURING METHOD THEREOF

CROSS-REFERENCE TO RELATED APPLICATIONS

This application is based upon and claims the benefit of priority from prior Japanese patent application No. 2019-118616, filed on Jun. 26, 2019, the entire contents of which are incorporated herein by reference.

TECHNICAL FIELD

The present disclosure relates to a wiring substrate and a manufacturing method of a wiring substrate.

BACKGROUND ART

Known is a wiring substrate including an insulating layer formed to cover a first wiring layer, opening portions formed in the insulating layer and configured to expose an upper surface of the first wiring layer, and a second wiring layer formed to fill the opening portions and extending to an upper surface of the insulating layer.

The second wiring layer is formed as follows, for example. First, the insulating layer is formed with opening portions for exposing an upper surface of the first wiring layer. Then, an entire surface of the insulating layer, including insides of the opening portions, is subjected to a plating pre-treatment, so that a seed layer is formed. Then, an electrolytic plating is selectively performed using the seed layer as an underlying base, so that an electrolytic plated layer is formed. Thereafter, the unnecessary seed layer is removed by etching in which the electrolytic plated layer is used as a mask, so that a second wiring layer consisting of the seed layer and the electrolytic plated layer is formed (for example, refer to PTL 1).

CITATION LIST

Patent Document

[PTL 1]
JP-A-2007-103878

However, the insulating layer may contain fillers. In this case, during the plating pre-treatment, the fillers exposed to inner wall surfaces of the opening portions may fall off. When the fillers fall off, the plating pre-treatment is not made in concave portions formed in marks where the fillers have fallen off, so that the seed layer is not attached in the concave portions. Since a growth of an electrolytic plating is prohibited in the part in which the seed layer is not attached, adhesion between the second wiring layer and the insulating layer is lowered.

SUMMARY OF DISCLOSURE

Aspect of non-limiting embodiments of the present disclosure is to provide a manufacturing method of a wiring substrate capable of improving adhesion between a wiring layer and an insulating layer.

A manufacturing method of a wiring substrate according to the present disclosure comprises:
forming an insulating layer containing fillers to cover a first wiring layer;
forming an opening portion, in which the first wiring layer is exposed, in the insulating layer;
sequentially performing a first alkali treatment, an ultrasonic cleaning treatment, and a second alkali treatment on an upper surface of the insulating layer, on an inner wall surface of the opening portion, and an upper surface of the first wiring layer exposed in the opening portion; and
forming a second wiring layer electrically connected to the first wiring layer by filling the opening portion by plating, the second wiring layer extending from an inside of the opening portion to the upper surface of the insulating layer.

According to the present disclosure, it is possible to provide the manufacturing method of a wiring substrate capable of improving adhesion between the wiring layer and the insulating layer.

DESCRIPTION OF DRAWINGS

Figure 1A:
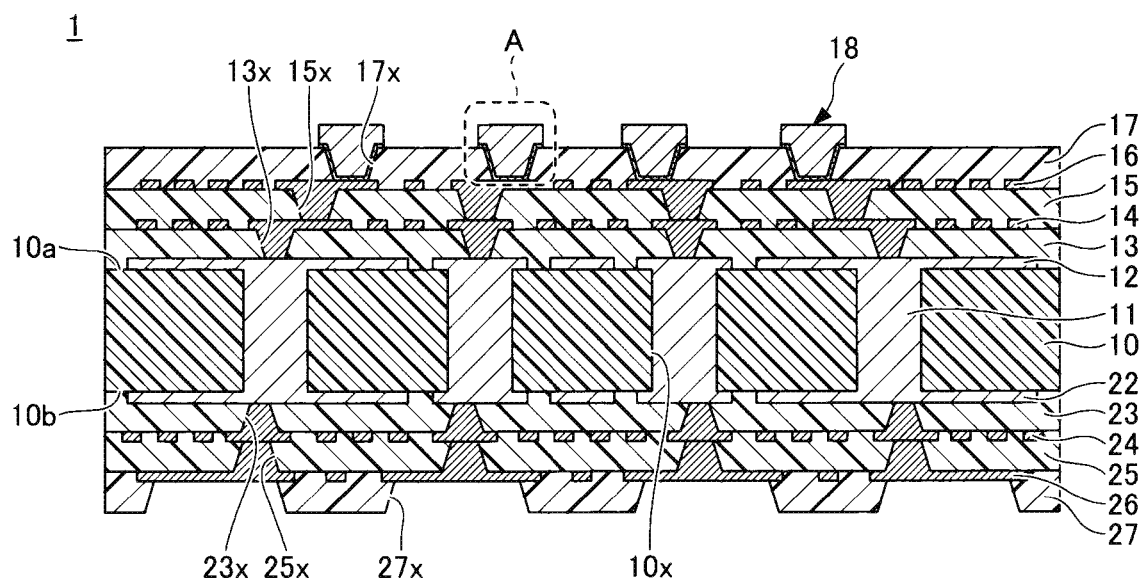
FIGS. 1A and 1B are sectional views exemplifying a wiring substrate in accordance with a first embodiment.

Hereinbelow, embodiments of the present disclosure will be described with reference to the drawings. Meanwhile, in the respective drawings, the same constituent parts are denoted with the same reference numerals, and the overlapping descriptions thereof may be omitted.

First Embodiment

[Structure of Wiring Substrate of First Embodiment]

Figure 1B:
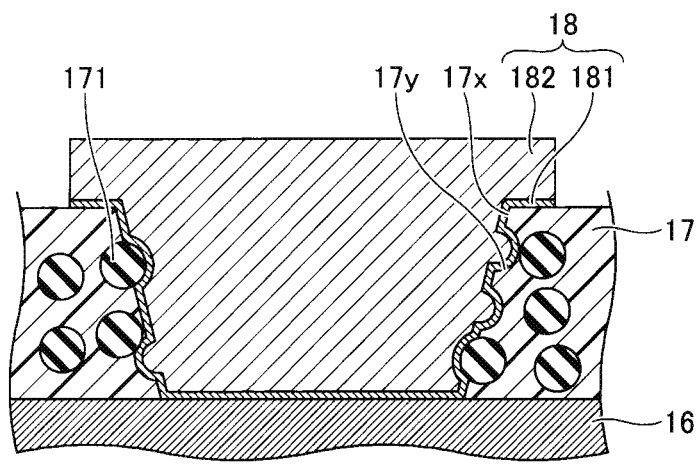

FIGS. 1A and 1B are sectional views exemplifying a wiring substrate in accordance with a first embodiment, in which FIG. 1A is an overall view and FIG. 1B is a partially enlarged view of an A part in FIG. 1A.

Referring to FIG. 1A, a wiring substrate 1 is a wiring substrate in which wiring layers and insulating layers are deposited on both sides of a core layer 10.

Specifically, in the wiring substrate 1, a wiring layer 12, an insulating layer 13, a wiring layer 14, an insulating layer 15, a wiring layer 16, a solder resist layer 17, and a wiring layer 18 are sequentially deposited on one surface 10a of the core layer 10. Also, a wiring layer 22, an insulating layer 23, a wiring layer 24, an insulating layer 25, a wiring layer 26, and a solder resist layer 27 are sequentially deposited on the other surface 10b of the core layer 10.

Meanwhile, in the first embodiment, for convenience, the solder resist layer 17-side of the wiring substrate 1 is referred to as 'upper side' or 'one side', and the solder resist layer 27-side is referred to as 'lower side' or 'other side'. Also, a surface of each part facing toward the solder resist layer 17 is referred to as 'one surface' or 'upper surface', and a surface facing toward the solder resist layer 27 is referred to as 'other surface' or 'lower surface'. However, the wiring substrate 1 can be used with being vertically reversed or can be arranged at any angle. Also, the description 'as seen from above' indicates that a target object is seen in a normal direction of one surface 10a of the core layer 10, and a planar shape indicates a shape of the target object as seen from the normal direction of one surface 10a of the core layer 10.

As the core layer 10, for example, a so-called glass epoxy substrate where an insulating resin such as an epoxy-based resin is impregnated in glass cloth may be used. As the core layer 10, a substrate where an epoxy-based resin or the like is impregnated in woven fabric or non-woven fabric of glass fiber, carbon fiber, aramid fiber and the like may also be used. A thickness of the core layer 10 is about 60 to 1000 μm, for example. The core layer 10 is formed with through-holes 10x penetrating the core layer 10 in a thickness direction. A planar shape of the through-hole 10x is circular, for example.

The wiring layer 12 is formed on one surface 10a of the core layer 10. Also, the wiring layer 22 is formed on the other surface 10b of the core layer 10. The wiring layer 12 and the wiring layer 22 are electrically interconnected by through-wirings 11 formed in the through-holes 10x. The wiring layers 12 and 22 are respectively patterned into a predetermined planar shape. For the wiring layers 12 and 22 and the through-wiring 11, copper (Cu) or the like may be used, for example. A thickness of each of the wiring layers 12 and 22 is about 10 to 40 μm, for example. In the meantime, the wiring layer 12, the wiring layer 22 and the through-wirings 11 may also be integrally formed.

The insulating layer 13 is an interlayer insulating layer formed on one surface 10a of the core layer 10 so as to cover the wiring layer 12. As a material of the insulating layer 13, for example, a non-photosensitive thermosetting resin of which a main component is an epoxy-based resin or the like may be used. A thickness of the insulating layer 13 is about 25 to 40 μm, for example. The insulating layer 13 contains fillers such as silicon dioxide ($SiO_2$). A particle size of the filler is, for example, about 0.1 to 10 μm. A content of the fillers is, for example, about 30 to 80 wt %.

The insulating layer 13 is formed with via-holes 13x that are opening portions. The via-holes 13x penetrate the insulating layer 13 to expose an upper surface of the wiring layer 12. The wiring layer 14 fills the via-holes 13x to electrically connect to the wiring layer 12, and extends from insides of the via-holes 13x to an upper surface of the insulating layer 13. Specifically, the wiring layer 14 includes via-wirings filled in via-holes 13x, and a wiring pattern formed on the upper surface of the insulating layer 13. The wiring pattern of the wiring layer 14 is electrically connected to the wiring layer 12 through the via-wirings. The via-hole 13x is a concave portion having an inverted conical shape of which a diameter of an opening portion opened toward the insulating layer 15 is larger than a diameter of a bottom surface of an opening portion formed by the upper surface of the wiring layer 12. A material of the wiring layer 14 and a thickness of the wiring pattern are similar to those of the wiring layer 12, for example.

The insulating layer 15 is an interlayer insulating layer formed on the upper surface of the insulating layer 13 so as to cover the wiring layer 14. A material and a thickness of the insulating layer 15 are similar to those of the insulating layer 13, for example. The insulating layer 15 contains fillers that are similar to those in the insulating layer 13, for example.

The insulating layer 15 is formed with via-holes 15x that are opening portions. The via-holes 15x penetrate the insulating layer 15 to expose an upper surface of the wiring layer 14. The wiring layer 16 fills the via-holes 15x to electrically connect to the wiring layer 14, and extends from insides of the via-holes 15x to an upper surface of the insulating layer 15. Specifically, the wiring layer 16 includes via-wirings filled in via-holes 15x, and a wiring pattern formed on the upper surface of the insulating layer 15. The wiring pattern of the wiring layer 16 is electrically connected to the wiring layer 14 through the via-wirings. The via-hole 15x is a concave portion having an inverted conical shape of which a diameter of an opening portion opened toward the solder resist layer 17 is larger than a diameter of a bottom surface of an opening portion formed by the upper surface of the wiring layer 14. A material of the wiring layer 14 and a thickness of the wiring pattern are similar to those of the wiring layer 12, for example.

The solder resist layer 17 is an outermost protective insulating layer on one side of the wiring substrate 1, and is formed on the upper surface of the insulating layer 15 so as to cover the wiring layer 16. The solder resist layer 17 may be formed of a photosensitive resin of which a main component is an epoxy-based resin or the like, for example. A thickness of the solder resist layer 17 is about 15 to 35 μm, for example.

The solder resist layer 17 contains, for example, fillers 171 of silicon dioxide ($SiO_2$), barium sulfate ($BaSO_4$) of the like. A particle size of the filler 171 is, for example, about 0.3 to 4 μm. A content of the fillers 171 is, for example, about 30 to 60 wt %.

The solder resist layer 17 is formed with opening portions 17x. The opening portions 17x penetrate the solder resist layer 17 to expose an upper surface of the wiring layer 16. The wiring layer 18 fills the opening portions 17x to electrically connect to the wiring layer 16, and extends from insides of the opening portions 17x to an upper surface of the solder resist layer 17. Specifically, the wiring layer 18 includes via-wirings filled in the opening portions 17x, and pads formed on the upper surface of the solder resist layer 17. The pads configuring the wiring layer 18 are electrically connected to the wiring layer 16 through the via-wirings. The opening portion 17x is a concave portion having an inverted conical shape of which a diameter of an opening portion opened toward the surface of the insulating layer 17 is larger than a diameter of a bottom surface of an opening portion formed by the upper surface of the wiring layer 16.

A planar shape of each of the pads configuring the wiring layer 18 is, for example, a circular shape having a diameter of about 35 to 85 μm. A pitch of the pads configuring the wiring layer 18 is, for example, about 40 to 100 μm. A thickness of each of the pads configuring the wiring layer 18 is, for example, about 10 to 30 μm. In the meantime, the pads configuring the wiring layer 18 function as electronic component mounting pads for electrical connection with an electrical component such as a semiconductor chip.

The wiring layer 18 has a seed layer 181 and an electrolytic plated layer 182, and has such a structure in which the electrolytic plated layer 182 is deposited on the seed layer 181. The seed layer 181 is continuously formed in a region of the upper surface of the solder resist layer 17 in the vicinity of the opening portions 17x, on inner wall surfaces of the opening portions 17x, and on the upper surface of the wiring layer 16 exposed in the opening portions 17x. A material of the seed layer 181 is, for example, copper. A thickness of the seed layer 181 is, for example, about 0.3 to 1 μm. A material of the electrolytic plated layer 182 is, for example, copper. The material of the electrolytic plated layer 182 may be nickel or tin, in addition to copper.

As shown in FIG. 1B, the fillers 171 contained in the solder resist layer 17 may partially protrude from an inner wall of the opening portion 17x or concave portions 17y that are marks where the fillers 171 contained in the solder resist layer 17 have fallen off may be formed on the inner wall surface of the opening portion 17x. In this case, the seed layer 181 is also formed on surfaces of the fillers 171 exposed from the inner wall surface of the opening portion 17x and on inner wall surfaces of the concave portions 17y.

That is, the seed layer 181 is formed in a substantially uniform thickness in the region of the upper surface of the solder resist layer 17 in the vicinity of the opening portions 17x, on the inner wall surfaces of the opening portions 17x, on the surfaces of the fillers 171 exposed from the inner wall surfaces of the opening portions 17x, on inner wall surfaces of the concave portions 17y, and on the upper surface of the wiring layer 16 exposed in the opening portions 17x. The reason will be described in paragraphs of a manufacturing method of the wiring substrate 1.

The electrolytic plated layer 182 is formed on the seed layer 181. The electrolytic plated layer 182 is formed to fill the opening portions 17x and to extend further upward than an upper surface of the seed layer 181 positioned in the vicinity of the opening portions 17x. Herein, a portion of the wiring layer 18 filled in the opening portion 17x is referred to as a via-wiring, and a portion protruding from the upper surface of the solder resist layer 17 is referred to as a pad.

In the meantime, a surface of each of the pads configuring the wiring layer 18 may be formed with a metal layer or may be formed with an organic film by performing an antioxidant treatment such as an OSP (Organic Solderability Preservative) treatment. As the metal layer, an Au layer, a Ni/Au layer (a metal layer having a Ni layer and an Au deposited in corresponding order), a Ni/Pd/Au layer (a metal layer having a Ni layer, a Pd layer and an Au layer deposited in corresponding order), a Sn layer and the like may be exemplified.

The insulating layer 23 is an interlayer insulating layer formed on the other surface 10b of the core layer 10 so as to cover the wiring layer 22. A material and a thickness of the insulating layer 23 are similar to those of the insulating layer 13, for example. The insulating layer 23 contains, for example, fillers similar to those in the insulating layer 13.

The insulating layer 23 is formed with via-holes 23x that are opening portions. The via-holes 23x penetrate the insulating layer 23 to expose a lower surface of the wiring layer 22. The wiring layer 24 fills the via-holes 23x to electrically connect to the wiring layer 22, and extends from insides of the via-holes 23x to a lower surface of the insulating layer 23. Specifically, the wiring layer 24 includes via-wirings filled in via-holes 23x, and a wiring pattern formed on the lower surface of the insulating layer 23. The wiring pattern of the wiring layer 24 is electrically connected to the wiring layer 22 through the via-wirings. The via-hole 23x is a concave portion having a conical shape of which a diameter of an opening portion opened toward the insulating layer 25 is larger than a diameter of a bottom surface of an opening portion formed by the lower surface of the wiring layer 22. A material of the wiring layer 24 and a thickness of the wiring pattern are similar to those of the wiring layer 12, for example.

The insulating layer 25 is an interlayer insulating layer formed on the lower surface of the insulating layer 23 so as to cover the wiring layer 24. A material and a thickness of the insulating layer 25 are similar to those of the insulating layer 13, for example. The insulating layer 25 contains, for example, fillers similar to those in the insulating layer 13.

The insulating layer 25 is formed with via-holes 25x that are opening portions. The via-holes 25x penetrate the insulating layer 25 to expose a lower surface of the wiring layer 24. The wiring layer 26 fills the via-holes 25x to electrically connect to the wiring layer 24, and extends from insides of the via-holes 25x to a lower surface of the insulating layer 25. Specifically, the wiring layer 26 includes via-wirings filled in via-holes 25x, and a wiring pattern formed on the lower surface of the insulating layer 25. The wiring pattern of the wiring layer 26 is electrically connected to the wiring layer 24 through the via-wirings. The via-hole 25x is a concave portion having a conical shape of which a diameter of an opening portion opened toward the solder resist layer 27 is larger than a diameter of a bottom surface of an opening portion formed by the lower surface of the wiring layer 24. A material of the wiring layer 26 and a thickness of the wiring pattern are similar to those of the wiring layer 12, for example.

The solder resist layer 27 is an outermost protective insulating layer on the other side of the wiring substrate 1, and is formed on the lower surface of the insulating layer 25 so as to cover the wiring layer 26. A material and a thickness of the solder resist layer 27 are similar to those of the solder resist layer 17, for example. The solder resist layer 27 contains, for example, fillers similar to those in the solder resist layer 17.

The solder resist layer 17 has opening portions 27x, and the lower surface of the wiring layer 26 is partially exposed in the opening portions 27x. A planar shape of the opening portion 27x is, for example, circular. The wiring layer 26 exposed in the opening portions 27x may be used as a pad for electrical connection with a mounting substrate (not shown) such as a motherboard. If necessary, the lower surface of the wiring layer 26 exposed in the opening portions 27x may be formed with the above-described metal layer or may be formed with an organic film by performing the antioxidant treatment such as OSP treatment.

[Manufacturing Method of Wiring Substrate of First Embodiment]

FIGS. 2A to 5C exemplify manufacturing processes of the wiring substrate of the first embodiment. FIGS. 2A to 2D, 4A, 4C and 5A to 5C are sectional views corresponding to FIG. 1A, and FIGS. 3A to 3D and 4B are sectional views corresponding to FIG. 1B. In the meantime, an example of the process for manufacturing one wiring substrate is herein described. However, a plurality of parts becoming wiring substrates may be manufactured and divided into individual parts to make the respective wiring substrates.

Figure 2A:
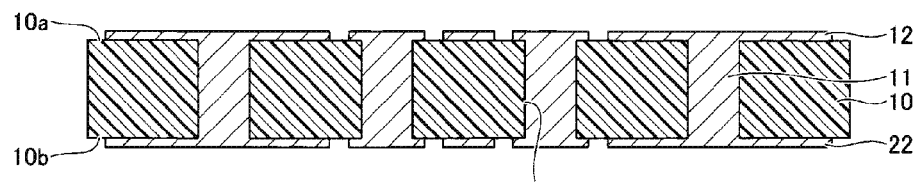
FIGS. 2A to 2D are views exemplifying a manufacturing process of the wiring substrate in accordance with the first embodiment (1 thereof).

First, in a process of FIG. 2A, a core layer 10 is formed with through-wirings 11 and wiring layers 12 and 22. Specifically, for example, a laminated plate where plain copper foils not patterned are formed on one surface 10a and the other surface 10b of the core layer 10 such as a so-called glass epoxy substrate is prepared. The copper foils on the respective surfaces of the prepared laminated plate are made to be thin, as required, and through-holes 10x penetrating the core layer 10 and the copper foils on the respective surfaces are formed by a laser processing method of using $CO_2$ laser or the like.

Then, a desmear treatment is performed to remove the remaining resin in the core layer 10, which is attached to the inner wall surfaces of the through-holes 10x, as needed. Then, a seed layer (copper or the like) configured to cover the copper foils on the respective surfaces and the inner wall surfaces of the through-holes 10x is formed by an electroless plating method, a sputter method or the like, for example, and an electrolytic plated layer (copper or the like) is formed on the seed layer by an electrolytic plating method in which the seed layer is used as a power feeding layer. Thereby, the through-holes 10x are filled by the electrolytic plated layer formed on the seed layer, and one surface 10a and the other surface 10b of the core layer 10 are formed with wiring layers 12 and 22 in which the copper foil, the seed layer and the electrolytic plated layer are deposited. Then, the wiring layers 12 and 22 are patterned into a predetermined planar shape by a subtractive method or the like.

Figure 2B:
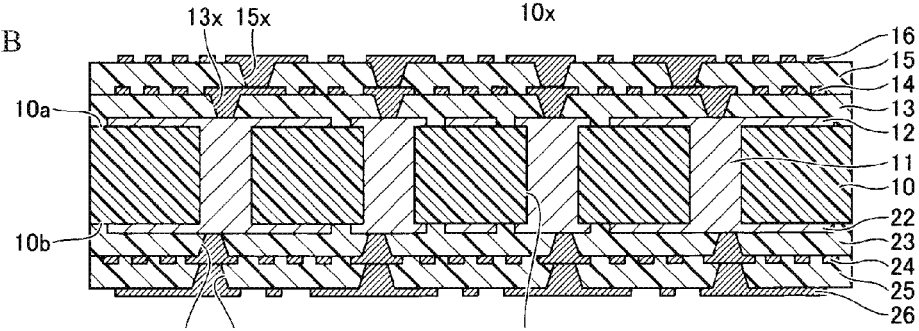

Subsequently, in a process of FIG. 2B, one surface 10a of the core layer 10 is formed with an insulating layer 13 by laminating a non-photosensitive thermosetting resin of which a main component is a semi-cured film-like epoxy-based resin or the like so as to cover the wiring layer 12 and curing the same. Also, the other surface 10b of the core layer 10 is formed with an insulating layer 23 by laminating a non-photosensitive thermosetting resin of which a main component is a semi-cured film-like epoxy-based resin or the like so as to cover the wiring layer 22 and curing the same. Alternatively, instead of the laminating of the film-like epoxy-based resin or the like, a liquid form or paste-like epoxy-based resin or the like may be applied and cured to form the insulating layers 13 and 23. A thickness of each of the insulating layers 13 and 23 is about 25 to 40 μm, for example.

Each of the insulating layer 13 and 23 contains fillers of silicon dioxide ($SiO_2$) or the like, for example. A particle size of the filler is, for example, about 0.1 to 10 μm. A content of the fillers is, for example, about 30 to 80 wt %.

Then, the insulating layer 13 is formed with via-holes 13x that are opening portions penetrating the insulating layer 13 and configured to expose an upper surface of the wiring layer 12. Also, the insulating layer 23 is formed with via-holes 23x that are opening portions penetrating the insulating layer 23 and configured to expose a lower surface of the wiring layer 22. The via-holes 13x and 23x may be formed by a laser processing method of using $CO_2$ laser or the like, for example. After forming the via-holes 13x and 23x, a desmear treatment is preferably performed to remove the remaining resin attached to surfaces of the wiring layers 12 and 22 exposed to bottom portions of the via-holes 13x and 23x.

Subsequently, the via-holes 13x are filled to form a wiring layer 14 that is electrically connected to the wiring layer 12 and extends from insides of the via-holes 13x to an upper surface of the insulating layer 13. The wiring layer 14 includes via-wirings filled in the via-holes 13x, and a wiring pattern formed on the upper surface of the insulating layer 13. A material of the wiring layer 14 and a thickness of the wiring pattern are similar to those of the wiring layer 12, for example. The wiring pattern of the wiring layer 14 is electrically connected to the wiring layer 12 exposed to bottom portions of the via-holes 13x.

Also, the via-holes 23x are filled to form a wiring layer 24 that is electrically connected to the wiring layer 22 and extends from insides of the via-holes 23x to a lower surface of the insulating layer 23. The wiring layer 24 includes via-wirings filled in the via-holes 23x, and a wiring pattern formed on the lower surface of the insulating layer 23. A material of the wiring layer 24 and a thickness of the wiring pattern are similar to those of the wiring layer 12, for example. The wiring layer 24 is electrically connected to the wiring layer 22 exposed to bottom portions of the via-holes 23x. The wiring layers 14 and 24 can be formed using a variety of wiring forming methods such as a semi-additive method, a subtractive method and the like.

Subsequently, an insulating layer 15 is formed on the upper surface of the insulating layer 13 so as to cover the wiring layer 14 by a similar formation method to that of the insulating layer 13. A material and a thickness of the insulating layer 15 are similar to those of the insulating layer 13, for example. Then, via-holes 15x are formed by a similar method to that of the via-holes 13x. Also, an insulating layer 25 is formed on the lower surface of the insulating layer 23 so as to cover the wiring layer 24 by a similar formation method to that of the insulating layer 13. A material and a thickness of the insulating layer 25 are similar to those of the insulating layer 13, for example. Then, via-holes 25x are formed by a similar method to that of the via-holes 13x. Each of the insulating layers 15 and 25 contains, for example, fillers similar to those in the insulating layer 13.

After forming the via-holes 15x and 25x, a desmear treatment is preferably performed to remove the remaining resin attached to surfaces of the wiring layers 14 and 24 exposed to bottom portions of the via-holes 15x and 25x.

Subsequently, the via-holes 15x are filled to form a wiring layer 16 that is electrically connected to the wiring layer 14 and extends from insides of the via-holes 15x to an upper surface of the insulating layer 15. The wiring layer 16 includes via-wirings filled in the via-holes 15x, and a wiring pattern formed on the upper surface of the insulating layer 15. A material of the wiring layer 16 and a thickness of the wiring pattern are similar to those of the wiring layer 12, for example. The wiring pattern of the wiring layer 16 is electrically connected to the wiring layer 14 exposed to bottom portions of the via-holes 15x.

Also, the via-holes 25x are filled to form a wiring layer 26 that is electrically connected to the wiring layer 24 and extends from insides of the via-holes 25x to a lower surface of the insulating layer 25. The wiring layer 26 includes via-wirings filled in the via-holes 25x, and a wiring pattern formed on the lower surface of the insulating layer 25. A material of the wiring layer 26 and a thickness of the wiring pattern are similar to those of the wiring layer 12, for example. The wiring layer 26 is electrically connected to the wiring layer 24 exposed to bottom portions of the via-holes 25x. The wiring layers 16 and 26 can be formed using a variety of wiring forming methods such as a semi-additive method, a subtractive method and the like.

Figure 2C:
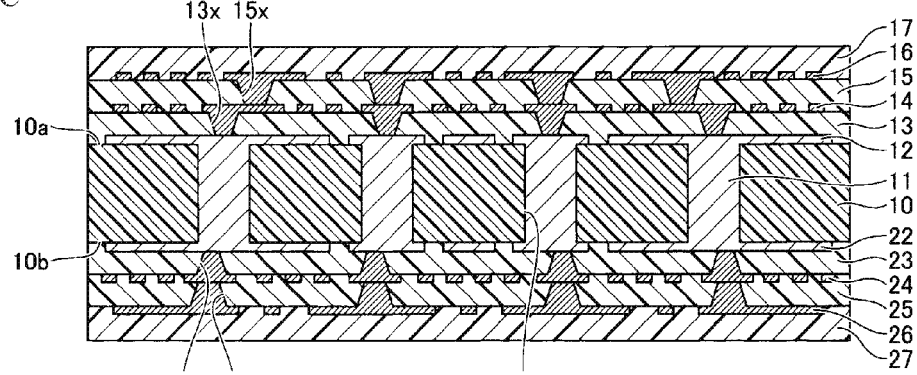

Subsequently, in a process of FIG. 2C, a solder resist layer 17 is formed on the upper surface of the insulating layer 15 so as to cover the wiring layer 16. Also, a solder resist layer 27 is formed on the lower surface of the insulating layer 25 so as to cover the wiring layer 26. The solder resist layer 17 may be formed by applying a liquid form or paste-like photosensitive epoxy-based insulating resin to the upper surface of the insulating layer 15 so as to cover the wiring layer 16 by a screen printing method, a roll coat method, a spin coat method or the like, for example. Alternatively, for example, the solder resist layer 17 may be formed by laminating a film-like photosensitive epoxy-based insulating resin on the upper surface of the insulating layer 15 so as to cover the wiring layer 16. The formation method of the solder resist layer 27 is similar to that of the solder resist layer 17.

In the meantime, each of the solder resist layers 17 and 27 contains, for example, fillers 171 of silicon dioxide ($SiO_2$), barium sulfate ($BaSO_4$) or the like. A particle size of the filler 171 is, for example, about 0.3 to 4 μm. A content of the fillers 171 is, for example, about 30 to 60 wt %.

Subsequently, in a process of FIG. 2D, by exposing and developing the solder resist layers 17 and 27, the solder resist layer 17 is formed with opening portions 17x for exposing portions of the upper surface of the wiring layer 16 (photolithography method). Also, the solder resist layer 27 is formed with opening portions 27x for exposing portions of the lower surface of the wiring layer 26 (photolithography method). A planar shape of each of the opening portions 17x and 27x is circular, for example. A diameter of each of the opening portions 17x and 27x may be arbitrarily designed in conformity to a connection target (a semiconductor chip, a motherboard and the like).

Figure 2D:
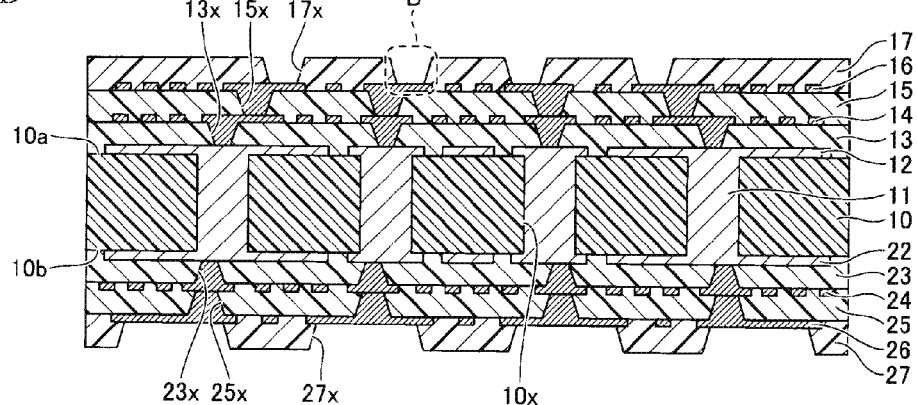
Figure 3A:
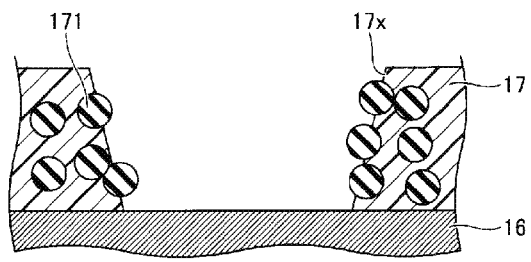
FIGS. 3A to 3D are views exemplifying a manufacturing process of the wiring substrate in accordance with the first embodiment (2 thereof).

FIG. 3A is an enlarged view of a B part of FIG. 2D. As shown in FIG. 3A, when the solder resist layer 17 is formed with the opening portion 17x, the fillers 171 are exposed on the inner wall surface of the opening portion 17x, for example. Also, although not shown, when the solder resist layer 27 is formed with the opening portion 27x, the fillers are exposed on the inner wall surface of the opening portion 27x.

Figure 3B:
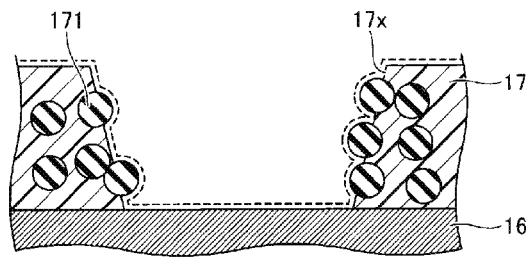

Then, in a process of FIG. 3B, a first alkali treatment is performed as a pre-treatment of an electroless plating. Specifically, for example, the upper surface of the solder resist layer 17, the inner wall surface of the opening portion 17x, the surfaces of the fillers 171 exposed from the inner wall surface of the opening portion 17x, and the upper surface of the wiring layer 16 exposed in the opening portion 17x are subjected to a treatment for about 4 to 5 minutes under temperature environment of about 50 to 60° C. by using a treatment solution in which an appropriate amount of a surfactant is added to 1.5 to 2% of sodium hydroxide. As the surfactant, for example, octylphenol ethoxylate (ether compound) and the like may be exemplified.

By the first alkali treatment, the upper surface of the solder resist layer 17, the inner wall surface of the opening portion 17x, the surfaces of the fillers 171 exposed from the inner wall surface of the opening portion 17x, and the upper surface of the wiring layer 16 exposed in the opening portion 17x are cleaned and conditioned. In the meantime, in FIG. 3B, the surfaces on which the cleaning and the conditioning have been made are shown with the broken line, for convenience.

As used herein, the cleaning is a cleaning treatment on the surface of the solder resist layer 17 for forming a seed layer (electroless plated layer) on the surface of the solder resist layer 17. Also, the conditioning is a conditioning treatment of a surface state of the solder resist layer 17.

In the first embodiment, the surface of the solder resist layer 17 is formed with the seed layer by an electroless plating treatment. By the cleaning and conditioning, a catalyst (palladium or the like) for precipitating an electroless plating can be easily adsorbed on the surface of the solder resist layer 17. Due to the presence of the catalyst, an electroless plated layer can be favorably formed on the surface of the solder resist layer 17. That is, the surface of the solder resist layer 17 can be favorably formed with the seed layer for forming an electrolytic plated layer.

Also, the resin configuring the solder resist layer 17 is wetted and swelled by the first alkali treatment. By the first alkali treatment, a force by which the solder resist layer 17 fixes the fillers 171 in the opening portion 17x is reduced, so that the fillers 171 are likely to fall off from the solder resist layer 17. More specifically, a force by which the resin configuring the solder resist layer 17 fixes the fillers 171 in the opening portion 17x is reduced by the compression stress due to the shrinkage on curing of the resin, so that the fillers 171 are likely to fall off from the resin. Also, the adhesion between the fillers 171 and the resin is reduced by the expansion and shrinkage of the resin and thus gaps are generated between the fillers 171 and the resin, so that the fillers 171 are likely to fall off from the resin.

Figure 3C:
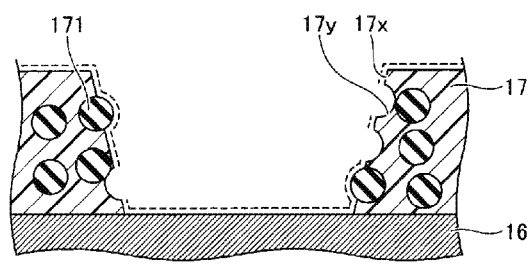

Then, in a process of FIG. 3C, an ultrasonic cleaning treatment is performed. The ultrasonic cleaning treatment is, for example, an ultrasonic water washing in which ultrasonic vibrations having a frequency of about 35 to 50 kHz are applied, and a treatment time thereof is about 3 to 10 minutes. By the ultrasonic cleaning treatment, the fillers 171 in a state (FIG. 3B) where they are likely to fall off are removed. After the removing, concave portions 17y that are marks formed as a result of removing the fillers 171 are formed on the inner wall surface of the opening portion 17x. The removed fillers 171 are removed from the inside of the opening portion 17x by the ultrasonic cleaning treatment. In the meantime, even when there are the fillers 171 that have fallen off before the ultrasonic cleaning treatment, the fallen-off fillers 171 are removed from the inside of the opening portion 17x by the ultrasonic cleaning treatment. The concave portions 17y are in a state where the cleaning and conditioning have not been made. In the meantime, in FIG. 3C, the cleaned and conditioned surfaces are shown with the broken line, for convenience.

Figure 3D:
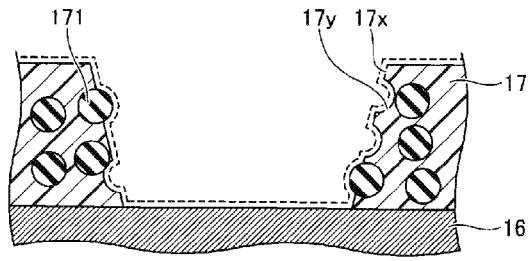

Subsequently, in a process of FIG. 3D, a second alkali treatment is performed. The second alkali treatment is performed under conditions in which the fillers 171 are more difficult to fall off from the solder resist layer 17 than in the first alkali treatment.

The second alkali treatment can be performed using the same kind of a treatment solution as that in the first alkali treatment, for example. In this case, the second alkali treatment can be performed by following conditions. That is, the second alkali treatment can be performed so as to satisfy one or more of (1) a treatment temperature of the second alkali treatment lower than a treatment temperature of the first alkali treatment, (2) a treatment time of the second alkali treatment shorter than a treatment time of the first alkali treatment, and (3) a treatment solution concentration of the second alkali treatment smaller than a treatment solution concentration of the first alkali treatment.

That is, when performing the second alkali treatment by using the same kind of a treatment solution as that in the first alkali treatment, the second alkali treatment is performed so as to satisfy any one of the conditions (1), (2) and (3), to satisfy the conditions (1) and (2), to satisfy the conditions (1) and (3), to satisfy the conditions (2) and (3), or to satisfy all the conditions (1), (2) and (3).

Specifically, for example, the upper surface of the solder resist layer 17, the inner wall surface of the opening portion 17x, the surfaces of the fillers 171 exposed from the inner wall surface of the opening portion 17x, the inner wall surfaces of the concave portions 17y, and the upper surface of the wiring layer 16 exposed in the opening portion 17x are subjected to a treatment for about 4 to 5 minutes under temperature environment of about 40 to 50° C. by using a solution in which an appropriate amount of a surfactant is added to 1 to 1.5% of sodium hydroxide. This is an example of the second alkali treatment that is performed so as to satisfy all the conditions (1), (2) and (3).

By the second alkali treatment, the upper surface of the solder resist layer 17, the inner wall surface of the opening portion 17x, the surfaces of the fillers 171 exposed from the inner wall surface of the opening portion 17x, the inner wall surfaces of the concave portions 17y, and the upper surface of the wiring layer 16 exposed in the opening portion 17x are cleaned and conditioned. In the meantime, in FIG. 3D, the cleaned and conditioned surfaces are shown with the broken line, for convenience.

Since the second alkali treatment is performed under conditions in which the fillers 171 are more difficult to fall off from the solder resist layer 17 than in the first alkali treatment, the resin configuring the solder resist layer 17 is difficult to be wetted. For this reason, in the second alkali treatment, there is no filler 171 that newly falls off. In other words, the conditions of the second alkali treatment are preferably decided so that there is no filler 171 that newly falls off in the second alkali treatment.

Figure 4A:
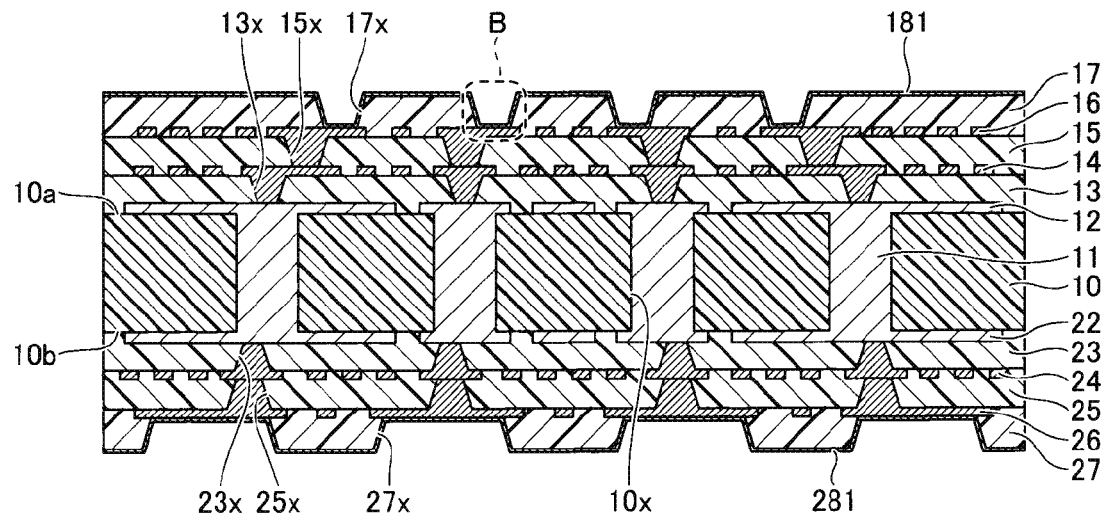
FIGS. 4A to 4C are views exemplifying a manufacturing process of the wiring substrate in accordance with the first embodiment (3 thereof).

Then, in a process of FIG. 4A, a seed layer 181 is continuously formed on the upper surface of the solder resist layer 17, on the inner wall surfaces of the opening portions 17x, and on the upper surface of the wiring layer 16 exposed in the opening portions 17x. Also, a seed layer 281 is continuously formed on a lower surface of the solder resist layer 27, on the inner wall surfaces of the opening portions 27x, and on the lower surface of the wiring layer 26 exposed in the opening portions 27x. A material of each of the seed layers 181 and 281 is, for example, copper. A thickness of each of the seed layers 181 and 281 is, for example, about 0.3 to 1 µm. The seed layers 181 and 281 can be formed by an electroless plating method, for example.

Figure 4B:
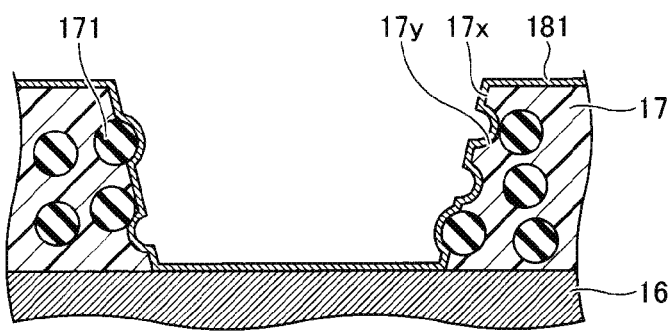

FIG. 4B is an enlarged view of a B part of FIG. 4A. As shown in FIG. 4B, the seed layer 181 is formed not only on the surfaces of the fillers 171 exposed from the inner wall surface of the opening portion 17x but also on the inner wall surfaces of the concave portions 17y. That is, the seed layer 181 is formed in a substantially uniform thickness on the upper surface of the solder resist layer 17, on the inner wall surface of the opening portion 17x, on the surfaces of the fillers 171 exposed from the inner wall surface of the opening portion 17x on the inner wall surfaces of the concave portions 17y, and on the upper surface of the wiring layer 16 exposed in the opening portion 17x. The seed layer 281 is also the same.

Figure 4C:
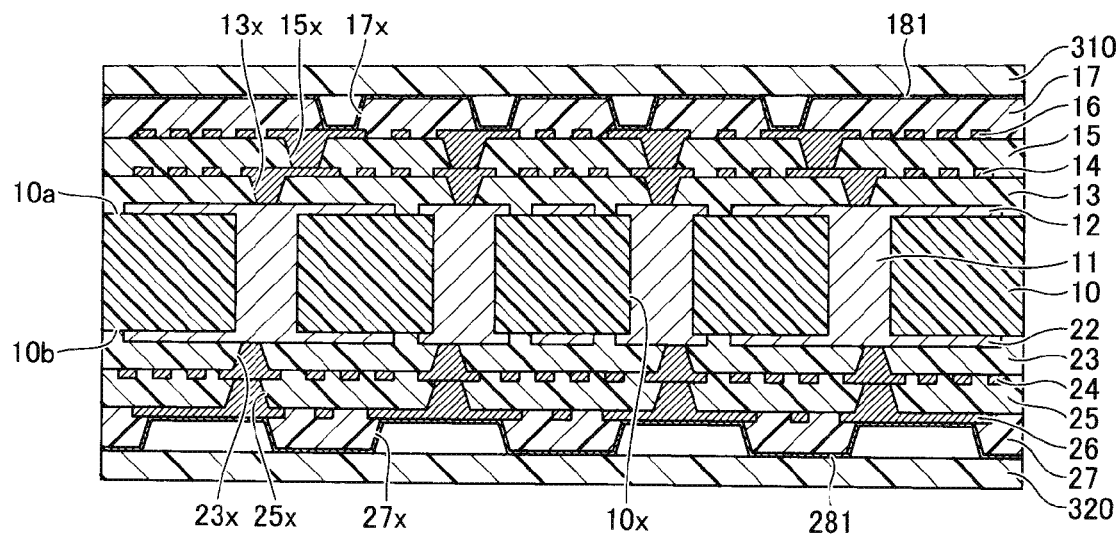

Then, in a process of FIG. 4C, a resist layer 310 is formed on an upper surface of the seed layer 181. Also, a resist layer 320 is formed on a lower surface of the seed layer 281. The resist layers 310 and 320 can be formed by laminating a photosensitive dry film resist, for example.

Figure 5A:
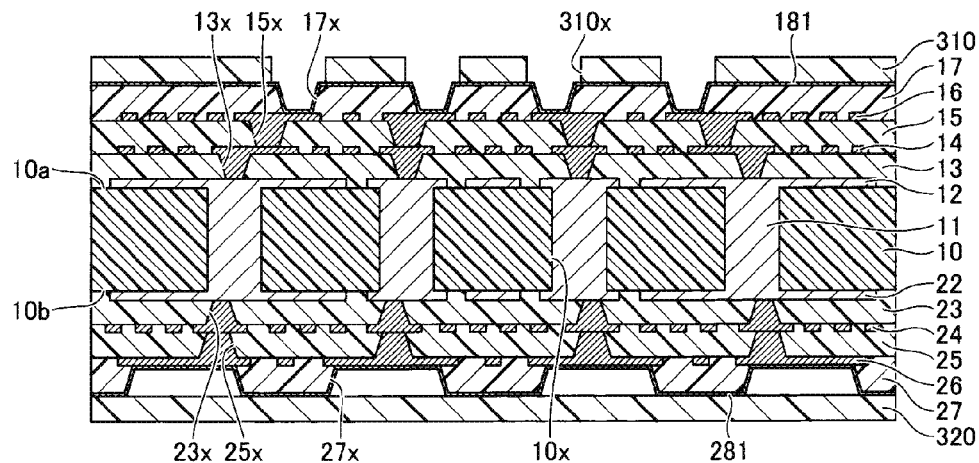
FIGS. 5A to 5C are views exemplifying a manufacturing process of the wiring substrate in accordance with the first embodiment (4 thereof).

Then, in a process of FIG. 5A, by exposing and developing the resist layer 310, the resist layer 310 is formed with opening portions 310x for exposing portions of the seed layer 181. The opening portions 310x are opened, in conformity to a shape of an electrolytic plated layer to be formed on the seed layer 181.

Figure 5B:
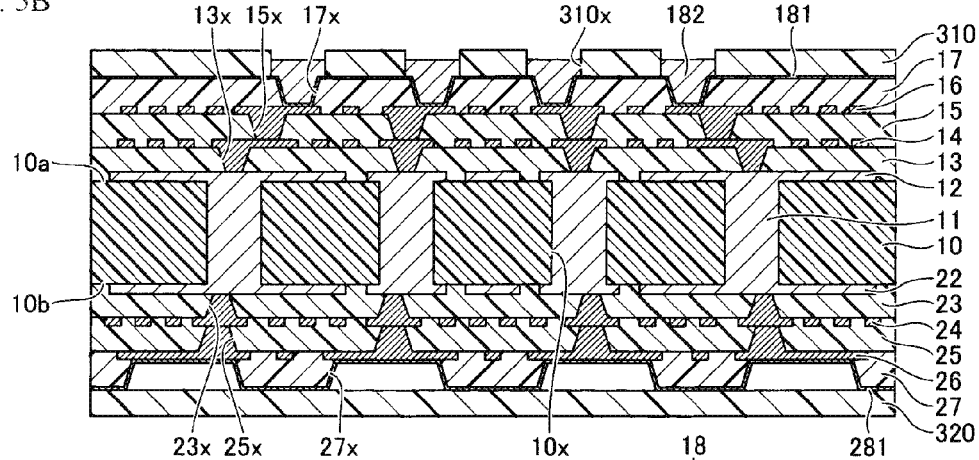

Then, in a process of FIG. 5B, copper or the like is precipitated on the seed layer 181 exposed in the opening portions 310x by an electrolytic plating method where power is fed from the seed layer 181, so that an electrolytic plated layer 182 is selectively formed. The electrolytic plated layer 182 is formed to fill the opening portions 17x and to extend further upward than the upper surface of the seed layer 181 around the opening portions 17x.

Figure 5C:
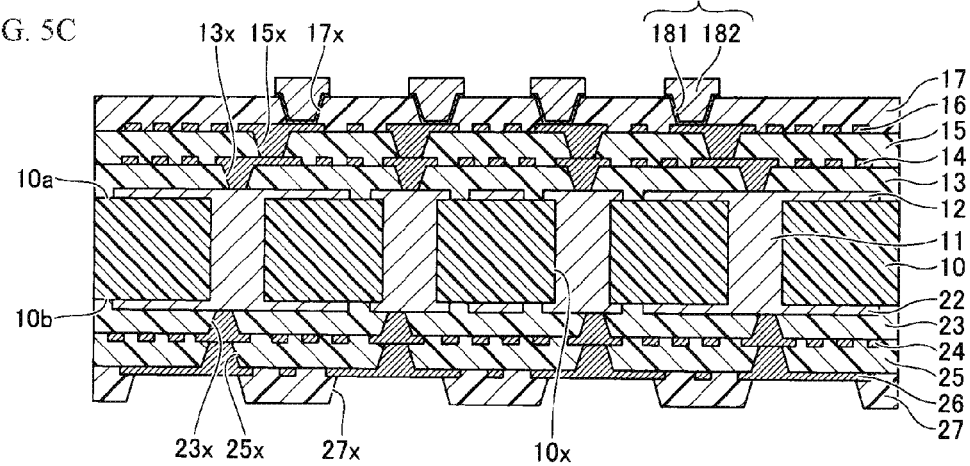

Then, in a process of FIG. 5C, the resist layers 310 and 320 are removed. The resist layers 310 and 320 can be removed using a peeling solution, for example. After removing the resist layers 310 and 320, an etching is performed using the electrolytic plated layer 182 as a mask, so that the seed layer 181 exposed from the electrolytic plated layer 182 is removed to form a wiring layer 18.

When the seed layer 181 and the electrolytic plated layer 182 are made of copper, a hydrogen peroxide/sulfuric acid-based aqueous solution, a sodium persulfate aqueous solution, an ammonium persulfate aqueous solution or the like may be used as an etching solution. At the same time as the removal of the seed layer 181, the seed layer 281 is also removed. By the above processes, a wiring substrate 1 is obtained.

FIGS. 6A to 7B exemplify a manufacturing method of a wiring substrate in accordance with a comparative example. In the manufacturing method of a wiring substrate in accordance with the comparative example, in a process of FIG. 6A, the solder resist layer 17 is formed with the opening portions 17x, similarly to the process of FIG. 3A. Also, in the process of FIG. 6A, an alkali treatment is performed as the pre-treatment of the electroless plating, similarly to the process of FIG. 3A. However, in the manufacturing method of a wiring substrate in accordance with the comparative example, the alkali treatment equivalent to the first alkali treatment in the manufacturing method of a wiring substrate in accordance with the first embodiment is performed only one time, and the process of the second alkali treatment is not performed. Also, the process of the ultrasonic cleaning treatment is not performed.

Figure 6A:
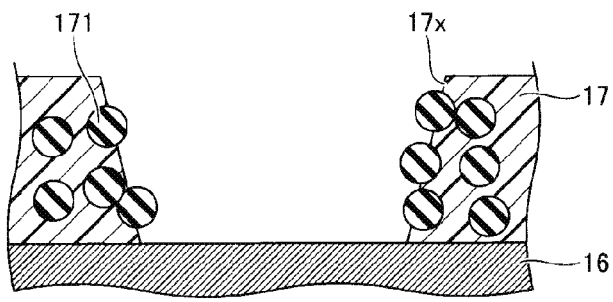
FIGS. 6A to 6D are views exemplifying a manufacturing method of a wiring substrate in accordance with a comparative example (1 thereof).
Figure 6B:
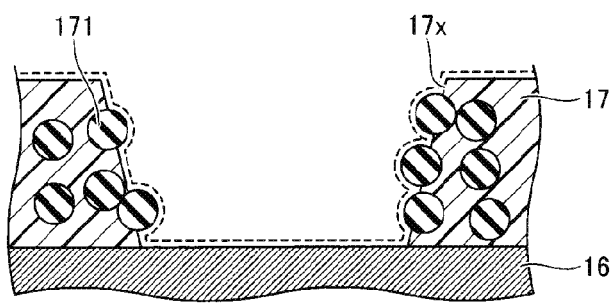
Figure 6C:
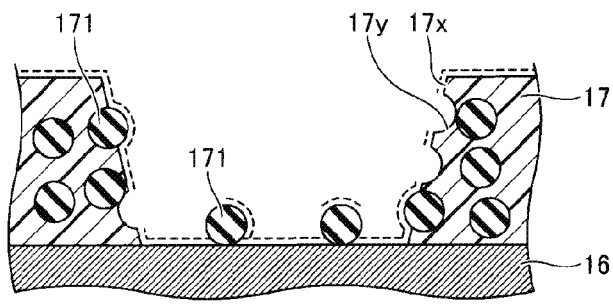

When the alkali treatment is performed in the process of FIG. 6B, the resin configuring the solder resist layer 17 is wetted and swelled. For this reason, as shown in FIG. 6C, a force by which the solder resist layer 17 fixes the fillers 171 in the opening portion 17x is reduced, so that the fillers 171 fall off from the solder resist layer 17.

In the manufacturing method of a wiring substrate in accordance with the comparative example, since the ultrasonic cleaning treatment is not performed, the fillers 171 having fallen off from the solder resist layer 17 are not removed from the opening portion 17x. Also, in the manufacturing method of a wiring substrate in accordance with the comparative example, since the second alkali treatment is not performed, the inner wall surfaces of the concave portions 17y, and portions of the surfaces of the fallen-off fillers 171 in the opening portion 17x are not cleaned and conditioned. In the meantime, in FIG. 6C, the cleaned and conditioned surfaces are shown with the broken line, for convenience.

Figure 6D:
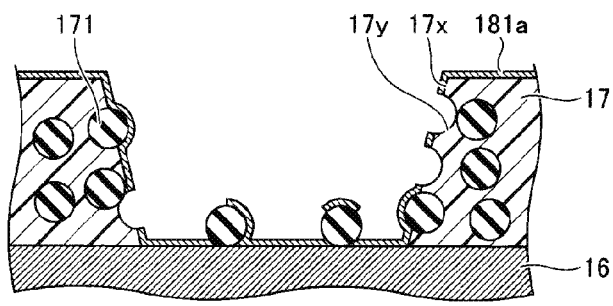

Then, as shown in FIG. 6D, the upper surface of the solder resist layer 17, the inner wall surface of the opening portion 17x, and the upper surface of the wiring layer 16 exposed in the opening portion 17x are formed with a seed layer 181a by an electroless plating method or the like. The catalyst is not adsorbed on the inner wall surfaces of the concave portions 17y on which the cleaning and conditioning have not been performed, so that the electroless plating is not precipitated. Likewise, the catalyst is not adsorbed on portions of the surfaces of the fallen-off fillers 171 on which the cleaning and conditioning have not been performed, so that an electroless plating is not precipitated. As a result, the seed layer 181a is not continuously formed and has discontinuous portions.

Figure 7A:
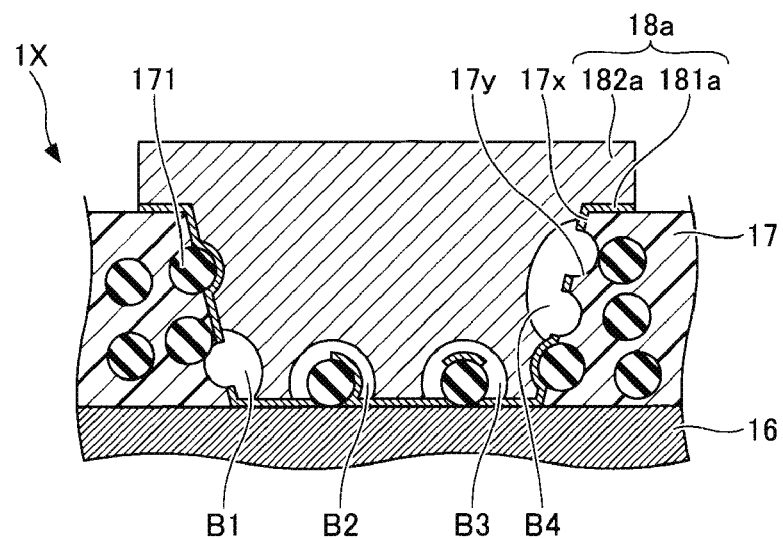
FIGS. 7A and 7B are views exemplifying the manufacturing method of a wiring substrate in accordance with the comparative example (1 thereof).

Subsequently, processes that are similar to the processes of FIGS. 4C to 5C in the manufacturing method of a wiring substrate in accordance with the first embodiment are performed. Thereby, as shown in FIG. 7A, a wiring layer 18a in which an electrolytic plated layer 182a is formed on the seed layer 181a is formed, and a wiring substrate 1X of the comparative example is completed. In the wiring substrate 1X, since the electrolytic plated layer 182a is not precipitated in the vicinity of portions in which the seed layer 181a is not formed, voids B1 to B4 are formed in the opening portion 17x, for example.

Figure 7B:
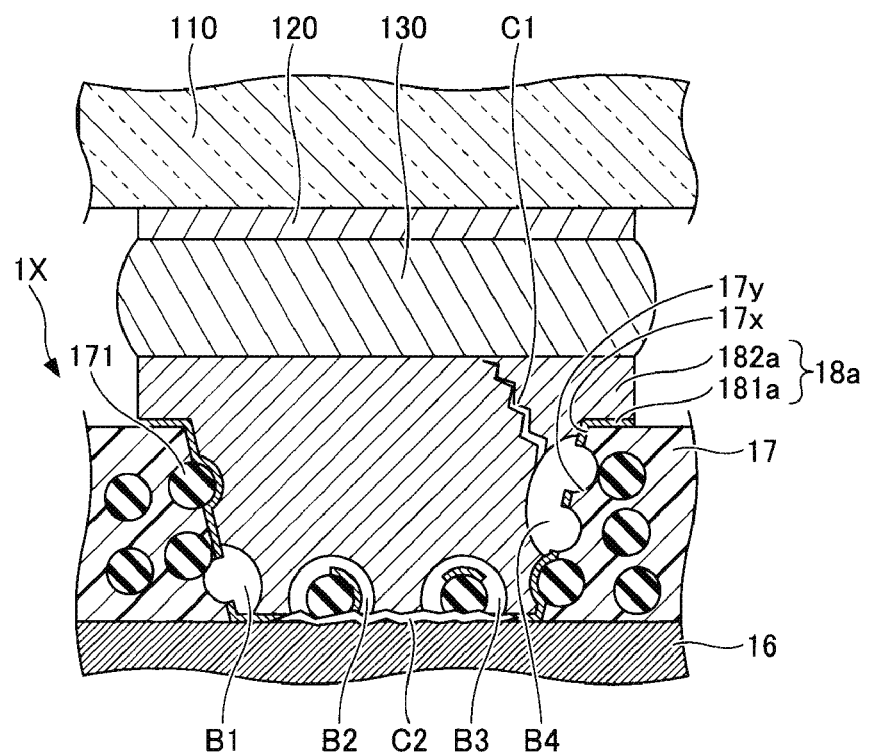

Then, as shown in FIG. 7B, a case is considered in which the wiring layer 18a of the wiring substrate 1X is electrically connected to an electrode pad 120 of a semiconductor chip 110 via a bump 130 that is a soldering bump or the like. As shown in FIG. 7A, since the voids B1 to B4 are formed in the opening portion 17x, places at which the voids B1 to B4 are present are likely to be starting points of cracks C1 and C2 when a load of electricity or heat is applied. When the cracks C1 and C2 are generated, a conduction failure may occur between the wiring layer 18a and the electrode pad 120, and connection reliability between the wiring substrate 1X and the semiconductor chip 110 is lowered.

In contrast, the manufacturing method of a wiring substrate in accordance with the first embodiment includes sequentially performing the first alkali treatment, the ultrasonic cleaning treatment and the second alkali treatment on the upper surface of the solder resist layer 17, the inner wall surfaces of the opening portions 17x and the upper surface of the wiring layer 16 exposed in the opening portions 17x between the processes of forming the opening portions 17x and forming the wiring layer 18.

For this reason, since places at which the cleaning and conditioning have not been made do not occur, the seed layer 181 is continuously formed without any unattached portions. As a result, since places at which the electrolytic plated layer 182 is not precipitated do not occur, no voids are formed in the opening portions 17x and no cracks originating from voids are generated.

As a result, adhesion between the solder resist layer 17 and the wiring layer 18 is improved, and a favorable adhesion force is obtained therebetween. Thereby, a problem that the wiring layer 18 is swelled due to poor adhesion between the solder resist layer 17 and the wiring layer 18 is avoided.

Also, since the ultrasonic cleaning treatment is performed on the wiring substrate 1, no filler 171 remains on the bottom portions of the opening portions 17x. Thereby, connection strength of a connection portion between the wiring layer 16 and the wiring layer 18 in the opening portion 17x is secured, and connection reliability between the wiring layer 16 and the wiring layer 18 is improved.

Also, when electrically connecting the wiring layer 18 of the wiring substrate 1 to the electrode pad 120 of the semiconductor chip 110 via the bump 130, there is no concern that a conduction failure is caused between the wiring layer 18 and the electrode pad 120. For this reason, connection reliability between the wiring substrate 1 and the semiconductor chip 110 can be improved.

Second Embodiment

In a second embodiment, an example where the manufacturing method of a wiring substrate of the present disclosure is applied to an internal wiring of the wiring substrate is described. Meanwhile, in the second embodiment, the descriptions of the same constituent components as the first embodiment described already may be omitted.

[Structure of Wiring Substrate of Second Embodiment]

Figure 8A:
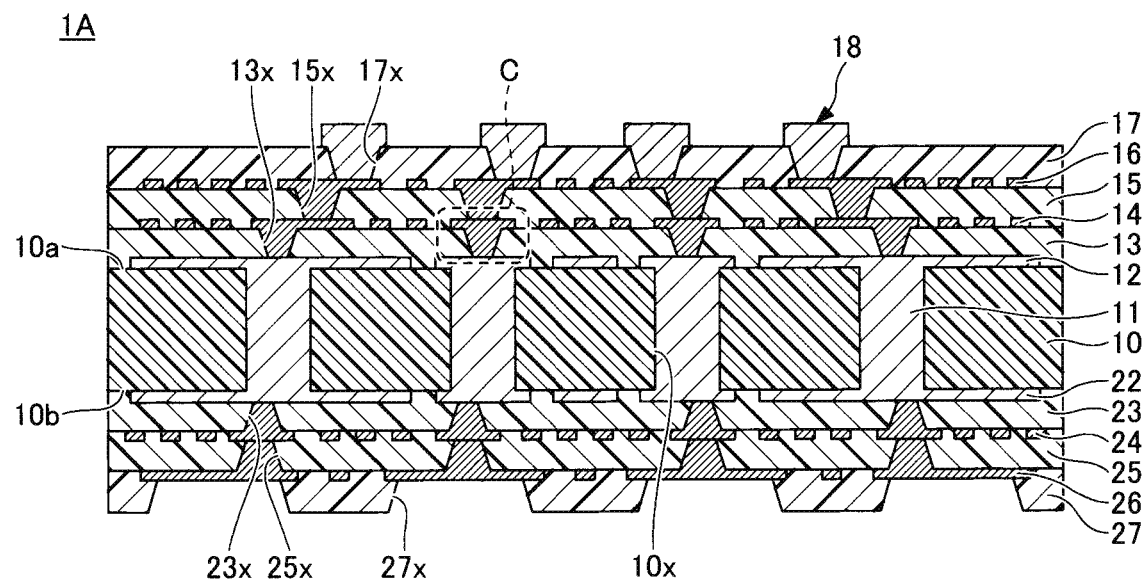
FIGS. 8A and 8B are sectional views exemplifying a wiring substrate in accordance with a second embodiment.
Figure 8B:
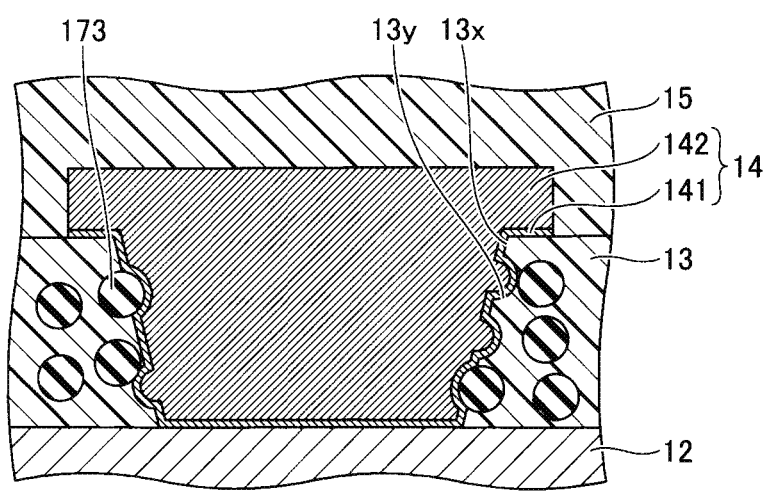

First, a structure of a wiring substrate in accordance with the second embodiment is described. FIGS. 8A and 8B are sectional views exemplifying the wiring substrate in accordance with the second embodiment, in which FIG. 8A is an overall view and FIG. 8B is a partially enlarged view of a C part of FIG. 8A.

Referring to FIG. 8A, in a wiring substrate 1A, the wiring layer 14 has a similar structure to the wiring layer 18 of the first embodiment. That is, the wiring layer 14 has a seed layer 141 and an electrolytic plated layer 142, and has a structure in which the electrolytic plated layer 142 is deposited on the seed layer 141. The wiring layers 16, 24 and 26 may each have a similar structure to the wiring layer 14.

The seed layer 141 is continuously formed in a region of the upper surface of the insulating layer 13 in the vicinity of the via-holes 13x, on the inner wall surfaces of the via-holes 13x, and on the upper surface of the wiring layer 12 exposed into the via-holes 13x. A material of the seed layer 141 is, for example, copper. A thickness of the seed layer 141 is, for example, about 0.3 to 1 μm.

As shown in FIG. 8B, fillers 173 contained in the insulating layer 13 may partially protrude from an inner wall of the via-hole 13x or concave portions 13y that are marks where the fillers 173 contained in the insulating layer 13 have fallen off may be formed on the inner wall surface of the via-hole 13x. In this case, the seed layer 141 is also formed on surfaces of the fillers 173 exposed from the inner wall surface of the via-hole 13x and inner wall surfaces of the concave portions 13y.

That is, the seed layer 141 is formed in a substantially uniform thickness in the region of the upper surface of the insulating layer 13 in the vicinity of the via-holes 13x, on the inner wall surfaces of the via-holes 13x, on the surfaces of the fillers 173 exposed from the inner wall surfaces of the via-holes 13x, on inner wall surfaces of the concave portions 13y, and on the upper surface of the wiring layer 12 exposed in the via-holes 13x. The reason will be described in paragraphs of a manufacturing method of the wiring substrate 1A.

The electrolytic plated layer 142 is formed on the seed layer 141. The electrolytic plated layer 142 is formed to fill the via-holes 13x and to extend further upward than the upper surface of the seed layer 141 positioned around the via-holes 13x. Herein, a portion of the wiring layer 14 filled in the via-hole 13x is referred to as a via-wiring, and a portion protruding from the upper surface of the insulating layer 13 is referred to as a wiring pattern.

In the meantime, the wiring pattern configuring the wiring layer 14 may be arranged from above the via-holes 13x to any position on the upper surface of the insulating layer 13. That is, the seed layer 141 may be arranged from above the via-holes 13x to any position on the upper surface of the insulating layer 13. Also in this case, the electrolytic plated layer 142 is deposited on the seed layer 141.

[Manufacturing Method of Wiring Substrate of Second Embodiment]

In the below, a manufacturing method of a wiring substrate in accordance with the second embodiment is described. FIGS. 9A to 10B exemplify the manufacturing process of the wiring substrate in accordance with the second embodiment. FIGS. 9A to 10B are sectional views corresponding to FIG. 8B. In the meantime, an example of the process for manufacturing one wiring substrate is herein described. However, a plurality of parts becoming wiring substrates may be manufactured and divided into individual parts to make the respective wiring substrates.

First, after performing a similar process to FIG. 2A of the first embodiment, one surface 10a of the core layer 10 is formed with an insulating layer 13 by laminating a non-photosensitive thermosetting resin of which a main component is a semi-cured film-like epoxy-based resin or the like so as to cover the wiring layer 12 and curing the same. Also, the other surface 10b of the core layer 10 is formed with an insulating layer 23 by laminating a non-photosensitive thermosetting resin of which a main component is a semi-cured film-like epoxy-based resin or the like so as to cover the wiring layer 22 and curing the same. Alternatively, instead of the laminating of the film-like epoxy-based resin or the like, a liquid form or paste-like epoxy-based resin or the like may be applied and cured to form the insulating layers 13 and 23. A thickness of each of the insulating layers 13 and 23 is about 25 to 40 µm, for example.

Each of the insulating layer 13 and 23 contains fillers 173 of silicon dioxide ($SiO_2$) or the like, for example. A particle size of the filler 173 is, for example, about 0.1 to 10 µm. A content of the fillers 173 is, for example, about 30 to 80 wt %.

Hereinafter, only one surface 10a-side of the core layer 10 is shown and described. However, the other surface 10b-side of the core layer 10 is also formed by similar processes.

Figure 9A:
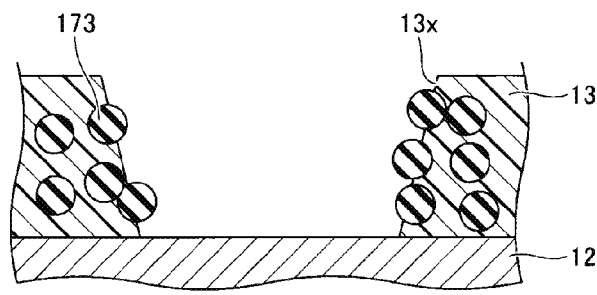
FIGS. 9A to 9D are views exemplifying a manufacturing process of the wiring substrate in accordance with the second embodiment (1 thereof).

Then, in a process of FIG. 9A, the insulating layer 13 is formed with via-holes 13x that are opening portions penetrating the insulating layer 13 and configured to expose an upper surface of the wiring layer 12. Also, the insulating layer 23 is formed with via-holes 23x that are opening portions penetrating the insulating layer 23 and configured to expose a lower surface of the wiring layer 22. The fillers 173 are exposed on inner wall surfaces of the via-holes 13x and 23x. The via-holes 13x and 23x may be formed by a laser processing method of using $CO_2$ laser or the like, for example. After forming the via-holes 13x and 23x, a desmear treatment is preferably performed to remove the remaining resin attached to surfaces of the wiring layers 12 and 22 exposed to bottom portions of the via-holes 13x and 23x.

Figure 9B:
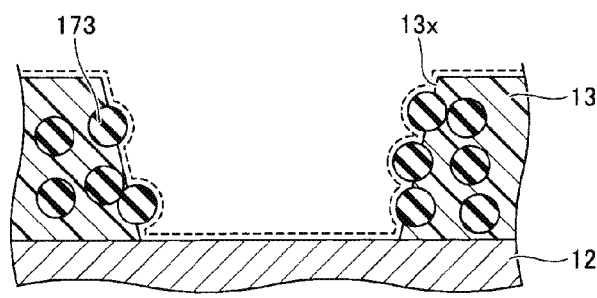

Subsequently, in a process of FIG. 9B, a first alkali treatment is performed as a pre-treatment of electroless plating. The details of the first alkali treatment are as described in the process of FIG. 3B.

By the first alkali treatment, the upper surface of the insulating layer 13, the inner wall surfaces of the via-holes 13x, the surfaces of the fillers 173 exposed from the inner wall surfaces of the via-holes 13x, and the upper surface of the wiring layer 12 exposed in the via-holes 13x are cleaned and conditioned. In the meantime, in FIG. 9B, the cleaned and conditioned surfaces are shown with the broken line, for convenience.

As used herein, the cleaning is a cleaning treatment on the surface of the insulating layer 13 for forming a seed layer (electroless plated layer) on the surface of the insulating layer 13. Also, the conditioning is a conditioning treatment of a surface state of the insulating layer 13.

In the second embodiment, the surface of the insulating layer 13 is formed with the seed layer by an electroless plating treatment. By the cleaning and conditioning, a catalyst (palladium or the like) for precipitating an electroless plating can be easily adsorbed on the surface of the insulating layer 13. Due to the presence of the catalyst, an electroless plated layer can be favorably formed on the surface of the insulating layer 13. That is, the surface of the insulating layer 13 can be favorably formed with the seed layer for forming an electrolytic plated layer.

Also, the lower surface of the insulating layer 23, the inner wall surfaces of the via-holes 23x, the surfaces of the fillers 173 exposed from the inner wall surfaces of the via-holes 23x and the lower surface of the wiring layer 22 exposed in the via-holes 23x are cleaned and conditioned by the first alkali treatment.

Also, the resin configuring the insulating layer 13 is wetted and swelled by the first alkali treatment. By the first alkali treatment, a force by which the insulating layer 13 fixes the fillers 173 in the via-hole 13x is reduced, so that the fillers 173 are likely to fall off from the insulating layer 13. Also, by the first alkali treatment, the resin configuring the insulating layer 23 is wetted and swelled. By the first alkali treatment, a force by which the insulating layer 23 fixes the fillers 173 in the via-hole 23x is reduced, so that the fillers 173 are likely to fall off from the insulating layer 23.

Figure 9C:
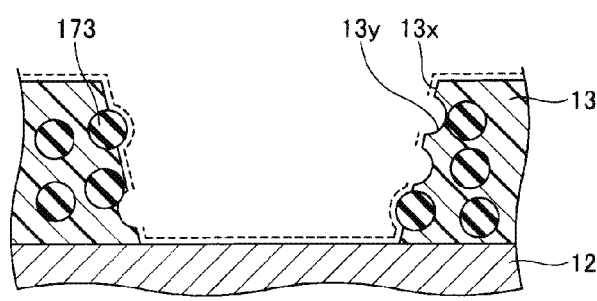

Then, in a process of FIG. 9C, an ultrasonic cleaning treatment is performed. The details of the ultrasonic cleaning treatment are as described in the process of FIG. 3C.

By the ultrasonic cleaning treatment, the fillers 173 in a state (FIG. 9B) where they are likely to fall off are removed. After the removing, concave portions 13y that are marks formed as a result of removing the fillers 173 are formed on the inner wall surface of the via-hole 13x. The removed fillers 173 are removed from an inside of the via-hole 13x by the ultrasonic cleaning treatment. In the meantime, even when there are the fillers 173 that have fallen off before the ultrasonic cleaning treatment, the fallen-off fillers 173 are removed from the inside of the via-hole 13x by the ultrasonic cleaning treatment. The concave portions 13y formed on the inner wall surface of the via-hole 13x are in a state where the cleaning and conditioning have not been made. In the meantime, in FIG. 9C, the cleaned and conditioned surfaces are shown with the broken line, for convenience.

Figure 9D:
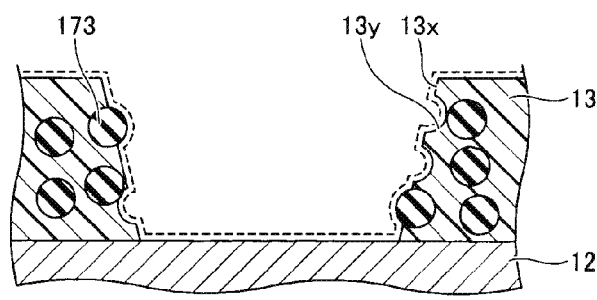

Then, in a process of FIG. 9D, a second alkali treatment is performed. The details of the second alkali treatment are as described in the process of FIG. 3D.

By the second alkali treatment, the upper surface of the insulating layer 13, the inner wall surfaces of the via-holes 13x, the surfaces of the fillers 173 exposed from the inner wall surfaces of the via-holes 13x, the inner wall surfaces of the concave portions 13y, and the upper surface of the wiring layer 12 exposed in the via-holes 13x are cleaned and conditioned. In the meantime, in FIG. 9D, the cleaned and conditioned surfaces are shown with the broken line, for convenience.

Also, by the second alkali treatment, the lower surface of the insulating layer 23, the inner wall surfaces of the via-holes 23x, the surfaces of the fillers 173 exposed from the inner wall surfaces of the via-holes 23x, the inner wall surfaces of the concave portions formed on the inner wall surfaces of the via-holes 23x, and the lower surface of the wiring layer 22 exposed in the via-holes 13x are cleaned and conditioned.

Figure 10A:
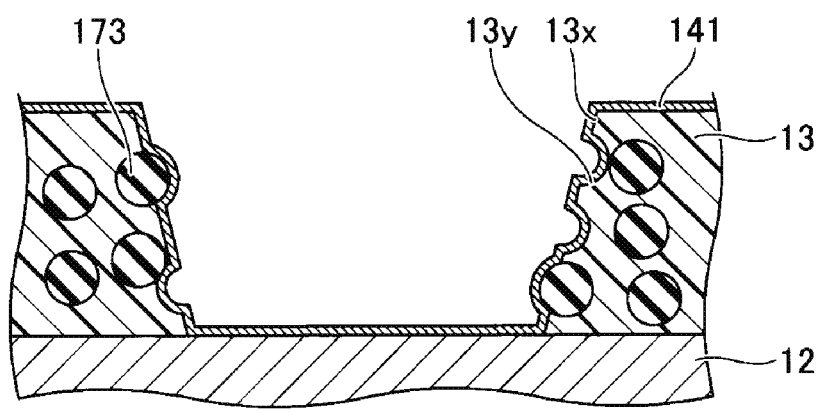
FIGS. 10A and 10B are views exemplifying a manufacturing process of the wiring substrate in accordance with the second embodiment (2 thereof).

Then, in a process of FIG. 10A, a seed layer 141 is continuously formed on the upper surface of the insulating layer 13, on the inner wall surfaces of the via-holes 13x, and the upper surface of the wiring layer 12 exposed in the via-holes 13x. Also, a seed layer is continuously formed on the lower surface of the insulating layer 23, on the inner wall surfaces of the via-holes 23x, and the lower surface of the wiring layer 22 exposed in the via-holes 23x. A material of the seed layer 141 is, for example, copper. A thickness of the seed layer 141 is, for example, about 0.3 to 1 µm. The seed layer 141 can be formed by an electroless plating method, for example. A material, a thickness and a manufacturing method of the seed layer formed on the lower surface of the wiring layer 22 are similar to those of the seed layer 141.

The seed layer 141 is also formed on the surfaces of the fillers 173 exposed from the inner wall surfaces of the via-holes 13x and on the inner wall surfaces of the concave portion 13y. That is, the seed layer 141 is formed in a substantially uniform thickness on the upper surface of the insulating layer 13, on the inner wall surfaces of the via-holes 13x, on the surfaces of the fillers 173 exposed from the inner wall surfaces of the via-holes 13x, on the inner wall surfaces of the concave portions 13y, and on the upper surface of the wiring layer 12 exposed in the via-holes 13x. The seed layer formed on the lower surface of the wiring layer 22 is also the same.

Figure 10B:
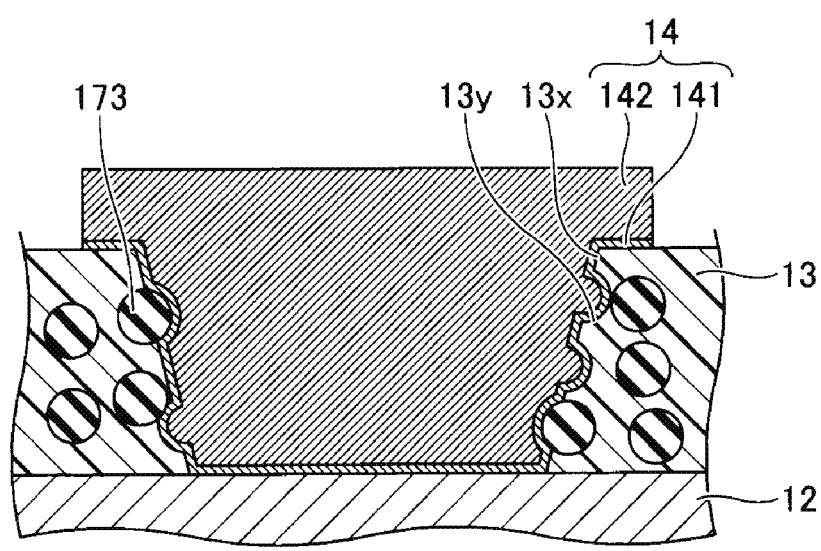

Then, in a process of FIG. 10B, wiring layers 14 and 24 are formed. Specifically, for example, a resist layer having opening portions is formed on the seed layer 141, in conformity to a shape of a wiring layer 14. Then, copper or the like is precipitated on the seed layer 141 exposed in the opening portions of the resist layer by an electrolytic plating method in which power is fed from the seed layer 141, so that an electrolytic plated layer 142 is selectively formed. Then, after removing the resist layer, an etching is performed using the electrolytic plated layer 142 as a mask, and the seed layer 141 exposed from the electrolytic plated layer 142 is removed, so that a wiring layer 14 having the electrolytic plated layer 142 deposited on the seed layer 141 is formed. The wiring layer 24 can also be formed by a similar method.

After the process of FIG. 10B, an insulating layer 15 is formed on the upper surface of the insulating layer 13 so as to cover the wiring layer 14 by a similar formation method to that of the insulating layer 13. A material and a thickness of the insulating layer 15 are, for example, similar to those of the insulating layer 13. Also, an insulating layer 25 is formed on the lower surface of the insulating layer 23 so as to cover the wiring layer 24 by a similar formation method to that of the insulating layer 13. A material and a thickness of the insulating layer 25 are, for example, similar to those of the insulating layer 13. Then, similar processes to FIGS. 9A to 10B are performed to form a wiring layer 16 having the electrolytic plated layer formed on the seed layer, on one side of the insulating layer 15. Also, a wiring layer 26 having the electrolytic plated layer formed on the seed layer is formed on the other side of the insulating layer 25.

Subsequently, similar processes to FIGS. 2C to 5C of the first embodiment are performed, so that a wiring substrate 1A is completed.

As described above, the manufacturing method of a wiring substrate of the present disclosure can be applied to the internal wirings (the wiring layers 14, 16, 24 and 26) of the wiring substrate 1A. Thereby, the similar effects to the first embodiment are achieved.

Application Examples of First Embodiment

In an application example of the first embodiment, an example of a semiconductor package in which a semiconductor chip is mounted on the wiring substrate of the first embodiment is described. Meanwhile, in the application example of the first embodiment, the descriptions of the same constituent components as the embodiments described already may be omitted.

Figure 11:
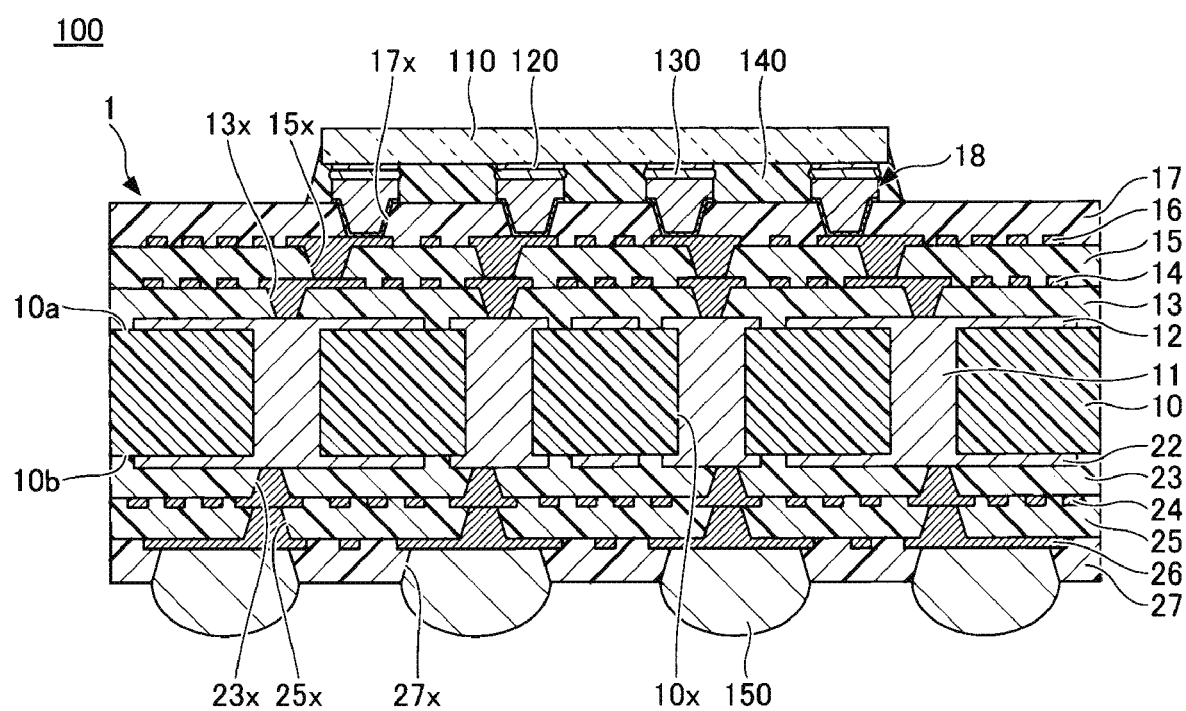
FIG. 11 is a sectional view exemplifying a semiconductor package in accordance with an application example of the first embodiment.

FIG. 11 is a sectional view exemplifying a semiconductor package in accordance with the application example of the first embodiment. Referring to FIG. 11, a semiconductor package 100 includes the wiring substrate 1 shown in FIG. 1A, a semiconductor chip 110, electrode pads 120, bumps 130, an under-fill resin 140 and bumps 150.

The semiconductor chip 110 has such a structure that a semiconductor integrated circuit (not shown) and the like are formed on a thinned semiconductor substrate (not shown) formed of silicon or the like, for example. The semiconductor substrate (not shown) is formed with the electrode pads 120 electrically connected to the semiconductor integrated circuit (not shown).

The bumps 130 are formed on the electrode pads 120 of the semiconductor chip 110, and are electrically connected to the wiring layer 18 of the wiring substrate 1. The under-fill resin 140 is filled between the semiconductor chip 110 and the upper surface of the wiring substrate 1. The bumps 150 are formed on the lower surface of the wiring layer 26 exposed in the bottom portions of the opening portions 27x of the solder resist layer 27. The bumps 150 are connected to a motherboard or the like, for example. The bumps 130 and 150 are, for example, soldering bumps. As a material of the soldering bump, for example, an alloy including Pb, an alloy of Sn and Cu, an alloy of Sn and Ag, an alloy of Sn, Ag and Cu and the like may be used.

In this way, the semiconductor package 100 in which the semiconductor chip 110 is mounted on the wiring substrate 1 of the first embodiment can be implemented. As described above, in the wiring substrate 1, no voids are formed in the opening portions 17x and no cracks originating from voids are not generated. For this reason, there is no concern that a conduction failure is caused between the wiring layer 18 and the electrode pads 120, and connection reliability between the wiring substrate 1 and the semiconductor chip 110 can be improved.

In the meantime, the wiring substrate 1A other than the wiring substrate 1 may be used in the semiconductor package 100.

Although the preferred embodiments have been described in detail, the present disclosure is not limited to the above embodiments and the embodiments can be diversely modified and replaced without departing from the scope defined in the claims.

For example, in the above embodiments, the present disclosure is applied to the wiring substrate including the core layer manufactured by a buildup process. However, the present disclosure can also be applied to a coreless wiring substrate manufactured by the buildup process, too. Also, the present disclosure is not limited thereto, and can be applied to a variety of wiring substrates.

What is claimed is:

1. A manufacturing method of a wiring substrate comprising:
   forming an insulating layer containing fillers to cover a first wiring layer;
   forming an opening portion, in which the first wiring layer is exposed, in the insulating layer;
   sequentially performing a first alkali treatment, an ultrasonic cleaning treatment, and a second alkali treatment on an upper surface of the insulating layer, on an inner wall surface of the opening portion, and an upper surface of the first wiring layer exposed in the opening portion; and
   forming a second wiring layer electrically connected to the first wiring layer by filling the opening portion by plating, the second wiring layer extending from an inside of the opening portion to the upper surface of the insulating layer.

2. The manufacturing method of a wiring substrate according to claim 1, wherein the forming of the second wiring layer comprises:
   forming a seed layer on the upper surface of the insulating layer, on the inner wall surface of the opening portion, and on the upper surface of the first wiring layer exposed in the opening portion; and
   selectively forming an electrolytic plated layer on the seed layer by an electrolytic plating method in which power is fed from the seed layer.

3. The manufacturing method of a wiring substrate according to claim 1, wherein the first alkali treatment is a treatment of wetting and swelling a resin configuring the insulating layer.

4. The manufacturing method of a wiring substrate according to claim 1, wherein the ultrasonic cleaning treatment is a treatment of removing the fillers exposed on the inner wall surface of the opening portion, and
   wherein concave portions that are marks formed as a result of removing the fillers are formed on the inner wall surface of the opening portion.

5. The manufacturing method of a wiring substrate according to claim 4, wherein the second alkali treatment is a treatment of cleaning and conditioning the upper surface of the insulating layer, the inner wall surface of the opening portion, the concave portions, and the upper surface of the first wiring layer exposed in the opening portion.

6. The manufacturing method of a wiring substrate according to claim 1, wherein the second alkali treatment is performed under conditions in which the fillers are more difficult to be removed than in the first alkali treatment.

7. The manufacturing method of a wiring substrate according to claim 6, wherein the second alkali treatment is performed using the same kind of a treatment solution as that in the first alkali treatment, and satisfies one or more of conditions of a treatment temperature of the second alkali treatment lower than the first alkali treatment, a treatment time of the second alkali treatment shorter than a treatment time of the first alkali treatment, and a treatment solution concentration of the second alkali treatment smaller than a treatment solution concentration of the first alkali treatment.

8. The manufacturing method of a wiring substrate according to claim 1, wherein the insulating layer is an outermost insulating layer, and
   wherein the second wiring layer comprises a via-wiring filled in the opening portion and electrically connected to the first wiring layer, and a pad formed on the via-wiring.

9. The manufacturing method of a wiring substrate according to claim 8, wherein the pad is an electronic component mounting pad for electrical connection with an electronic component.

10. The manufacturing method of a wiring substrate according to claim 1, wherein the insulating layer is an interlayer insulating layer, and
    wherein the second wiring layer comprises a via-wiring filled in the opening portion and electrically connected to the first wiring layer, and a wiring pattern formed on the via-wiring.

* * * * *